US012804329B2

(12) United States Patent
Wan et al.

(10) Patent No.: US 12,804,329 B2
(45) Date of Patent: Nov. 17, 2026

(54) SOUNDING COMPONENT AND PIEZOELECTRIC SPEAKER

(71) Applicant: MERRY ELECTRONICS (SUZHOU) CO., LTD., Jiangsu Province (CN)

(72) Inventors: Huaming Wan, Jiangsu Province (CN); Mingya Luo, Jiangsu Province (CN); Chunlong Zheng, Jiangsu Province (CN)

(73) Assignee: MERRY ELECTRONICS (SUZHOU) CO., LTD., Jiangsu Province (CN)

( * ) Notice: Subject to any disclaimer, the term of this patent is extended or adjusted under 35 U.S.C. 154(b) by 148 days.

(21) Appl. No.: 18/819,329

(22) Filed: Aug. 29, 2024

(65) Prior Publication Data

US 2025/0133351 A1 Apr. 24, 2025

(30) Foreign Application Priority Data

Oct. 18, 2023 (CN) ......................... 202311352207.0
May 30, 2024 (CN) ......................... 202410692146.0

(51) Int. Cl.

*H04R 17/00* (2006.01)
*H04R 1/02* (2006.01)
*H10N 30/50* (2023.01)

(52) U.S. Cl.

CPC ............. *H04R 17/00* (2013.01); *H04R 1/021* (2013.01); *H10N 30/50* (2023.02)

(58) Field of Classification Search

CPC ........ H04R 17/00; H04R 1/021; H04R 31/00; H04R 31/003; H04R 1/06; H10N 30/50; G02F 1/133308

See application file for complete search history.

(56) References Cited

U.S. PATENT DOCUMENTS 6,420,818 B1 * 7/2002 Kishimoto ............. H04R 17/00 310/368
6,427,017 B1 * 7/2002 Toki .................. G02F 1/133308 381/333
6,445,108 B1 * 9/2002 Takeshima ............. H04R 17/00 310/322
6,653,762 B2 * 11/2003 Takeshima ............... H04R 1/06 310/330

(Continued)

FOREIGN PATENT DOCUMENTS

CN 100350817 C 11/2007
CN 202551340 U 11/2012

(Continued)

*Primary Examiner* — Angelica M Mckinney

(74) *Attorney, Agent, or Firm* — Birch, Stewart, Kolasch & Birch, LLP

(57) ABSTRACT

The embodiments of the present disclosure disclose a sounding component and a piezoelectric speaker, wherein the sounding component comprises at least one layer of conductive bracket and multiple layers of piezoelectric vibration unit. Each layer of conductive bracket is formed with at least one notch, and a layer of conductive bracket is connected between adjacent two layers of piezoelectric vibration unit so that the sounding component may emit sound through the notch. Thus, by setting conductive brackets with notches to determine the sound direction, it helps to meet the design requirements of piezoelectric speaker side sound output.

16 Claims, 13 Drawing Sheets

(56) References Cited

U.S. PATENT DOCUMENTS

| | | | | |
|---|---|---|---|---|
| 7,141,919 | B1 * | 11/2006 | Hamada | H04R 31/003<br>310/324 |
| 2007/0228893 | A1 * | 10/2007 | Yamauchi | H04R 17/00<br>310/348 |
| 2017/0303049 | A1 * | 10/2017 | Salmon | B81B 7/0061 |
| 2018/0035200 | A1 | 2/2018 | Abe et al. | |
| 2018/0270583 | A1 | 9/2018 | Yokoi et al. | |

FOREIGN PATENT DOCUMENTS

| | | | |
|---|---|---|---|
| CN | 110049115 | A | 7/2019 |
| CN | 215183049 | U | 12/2021 |
| CN | 116866787 | A | 10/2023 |
| CN | 117479088 | A | 1/2024 |

* cited by examiner

SOUNDING COMPONENT AND PIEZOELECTRIC SPEAKER

CLAIM OF PRIORITY AND CROSS-REFERENCE TO RELATED APPLICATION(S)

This application claims the benefits of Chinese Patent Application No. 202311352207.0, filed on Oct. 18, 2023, and Chinese Patent Application No. 202410692146.0, filed on May 30, 2024, which are incorporated herein by reference in their entirety.

BACKGROUND OF THE DISCLOSURE

1. Field of the Disclosure

The present disclosure relates to the field of piezoelectric speaker technology, and particularly to a sounding component and a piezoelectric speaker.

2. Description of the Related Art

The existing piezoelectric speakers mainly adopt single piece, multiple single piece parallel unfolding, or multiple flexible piezoelectric film stacking designs, which are only suitable for piezoelectric speakers with positive sound output and cannot meet the design requirements of piezoelectric speaker side sound output.

BRIEF DESCRIPTION OF THE DISCLOSURE

In view of this, the present disclosure provides a sounding component and a piezoelectric speaker, by setting up a conductive bracket with a notch to determine the direction of sound emission, in order to meet the design requirements of the piezoelectric speaker for side sound outlet.

In the first aspect, the embodiment of the present disclosure provide a first sounding component, which includes: at least one layer of conductive bracket, each layer of conductive bracket is formed with at least one notch; and multiple layers of piezoelectric vibration unit, the piezoelectric vibration unit includes two conductive thin films and a piezoelectric thin film disposed between the two conductive thin films, with a layer of conductive bracket connecting between adjacent two layers of piezoelectric vibration unit, so that the sounding component may emit sound through the notch.

In one embodiment, each layer of the conductive bracket is formed into a U-shaped structure.

In one embodiment, there are multiple layers of conductive bracket, and the notches of adjacent two layers of the conductive bracket face in opposite directions.

In one embodiment, each layer of the conductive bracket includes two oppositely arranged strip-shaped connecting pieces, and the two connecting pieces are arranged at both ends of the piezoelectric vibration unit.

In one embodiment, the conductive bracket is connected to the corresponding conductive thin films through conductive adhesive.

In one embodiment, the sounding component includes two conductive sheets and a piezoelectric sheet positioned between the two conductive sheets; each conductive sheet is folded to form multiple layers of the conductive thin film; the piezoelectric sheet is folded to form multiple layers of the piezoelectric thin film.

In one embodiment, multiple convex parts are formed on each layer of the piezoelectric vibration unit by arching up.

In one embodiment, the convex parts on two adjacent layers of the piezoelectric vibration units are staggered.

In the second aspect, the embodiment of the present disclosure also provide a second sounding component, which includes: multiple layers of piezoelectric vibration unit, wherein the piezoelectric vibration unit comprises two layers of conductive thin film and a piezoelectric thin film disposed between the two layers of conductive thin film; and at least one layer of conductive bracket, each layer of the conductive bracket being formed with at least one notch, the position of each notch matching the side of the piezoelectric vibration unit; wherein, a layer of the conductive bracket is connected between two adjacent layers of the piezoelectric vibration unit, so that the sounding component may emit sound through the notch side.

In one embodiment, each layer of the conductive bracket is formed into a U-shaped structure.

In one embodiment, there are multiple layers of conductive bracket, and the notches of adjacent two layers of the conductive bracket face in opposite directions.

In one embodiment, each layer of the conductive bracket includes two oppositely arranged strip-shaped connecting pieces, and the two connecting pieces are arranged at both ends of the piezoelectric vibration unit.

In one embodiment, the conductive bracket is connected to the corresponding conductive thin films through conductive adhesive.

In one embodiment, the sounding component includes two conductive sheets and a piezoelectric sheet positioned between the two conductive sheets; each conductive sheet is folded to form multiple layers of the conductive thin film; the piezoelectric sheet is folded to form multiple layers of the piezoelectric thin film.

In one embodiment, multiple convex parts are formed on each layer of the piezoelectric vibration unit by arching up.

In one embodiment, the convex parts on two adjacent layers of the piezoelectric vibration units are staggered.

In the third aspect, the embodiment of the present disclosure also provide a third sounding component, which includes: multiple layers of piezoelectric vibration unit, wherein the piezoelectric vibration unit comprises two layers of conductive thin film and a piezoelectric thin film arranged between two layers of the conductive thin film; multiple convex parts are raised on each layer of the piezoelectric vibration unit; sound outlet channels are formed between some adjacent two layers of the piezoelectric vibration unit; the convex parts on two layers of the piezoelectric vibration unit corresponding to each sound outlet channel are raised towards the sound outlet channel.

In one embodiment, the convex parts on the two layers of piezoelectric vibration unit corresponding to each sound outlet are arranged in a staggered manner.

In one embodiment, the sounding component also includes: at least one layer conductive bracket, each layer of the conductive bracket having at least one notch, the position of the notch matching the side of the piezoelectric vibration unit; wherein, the notch is formed as the sound outlet channel, and a layer of the conductive bracket is connected between two adjacent layers of the piezoelectric vibration unit, so that the sounding component may emit sound through the side of the notch.

In one embodiment, each layer of the conductive bracket is formed into a U-shaped structure.

In one embodiment, there are multiple layers of conductive bracket, and the notches of adjacent two layers of the conductive bracket face in opposite directions.

In one embodiment, the conductive bracket is connected to the corresponding conductive thin films through conductive adhesive.

In one embodiment, the convex parts on two adjacent layers of the piezoelectric vibration units are staggered.

In one embodiment, the sounding component includes two conductive sheets and a piezoelectric sheet positioned between the two conductive sheets; each conductive sheet is folded to form multiple layers of the conductive thin film; the piezoelectric sheet is folded to form multiple layers of the piezoelectric thin film.

In the fourth aspect, the embodiment of the present disclosure also provide a fourth sounding component, which includes: at least one layer of conductive bracket, each layer of the conductive bracket is formed with at least one notch; and multiple layers of piezoelectric vibration unit, the piezoelectric vibration unit includes a first piezoelectric ceramic, a second piezoelectric ceramic, a third piezoelectric ceramic, a metal substrate, and an elastic thin film, stacked in sequence, a layer of conductive sheet is connected between adjacent two layers of piezoelectric vibration unit, so that the sounding component may emit sound through the notch.

In one embodiment, the first piezoelectric ceramic and the third piezoelectric ceramic are arranged in a first polarization direction, the second piezoelectric ceramic is arranged in a second polarization direction, and the first polarization direction is opposite to the second polarization direction.

In one embodiment, the electrode connecting ways of adjacent two layers of the piezoelectric vibration unit are opposite.

In one embodiment, the metal substrate extends to both sides in the first extending direction, forming first extending parts; the elastic thin film extends to both sides in the first extending direction, forming second extending parts; the first extending parts and the second extending parts are sandwiched between two layers of conductive brackets.

In one embodiment, profiling grooves are recessed on the conductive bracket, the profiling grooves are matched with the first extending parts, and the first extending parts are embedded in the profiling grooves.

In one embodiment, the elastic thin film extends to both sides in the second extending direction, forming third extending parts, the third extending parts are connected to the conductive bracket.

In one embodiment, the conductive bracket is formed into a U-shaped structure.

In one embodiment, there are multiple layers of conductive bracket, and the notches of adjacent two layers of the conductive bracket face in opposite directions.

In one embodiment, two layers of the conductive bracket located at the edge position are enclosed along the end face to form blocking parts.

In the fifth aspect, the present disclosure further provides a piezoelectric loudspeaker, which includes: a housing, on which a sound outlet is provided; and a sounding component as described in the first, second, third, or fourth aspect, which is arranged inside the housing, and the sound outlet channel formed by at least some of the notches is aligned with the sound outlet.

In one embodiment, the housing has an accommodating groove, and the groove wall opposite to the sound outlet is provided with a first through hole.

The embodiment of the present disclosure provides a sounding component and a piezoelectric speaker, wherein the sounding component comprises at least one layer of conductive bracket and multiple layers of piezoelectric vibration units. Each layer of conductive bracket is formed with at least one notch, and a layer of conductive bracket is connected between two adjacent layers of piezoelectric vibration unit, so that the sounding component may emit sound through the notch. Thus, by arranging conductive brackets with notches to determine the sound emitting direction, it helps to meet the design requirements of the piezoelectric speaker for side sound emission.

BRIEF DESCRIPTION OF THE DRAWINGS

The above and other objectives, features, and advantages of the disclosure will become clearer through the description of the embodiment of the disclosure with reference to the accompanying drawings, in which.

DETAILED DESCRIPTION OF EMBODIMENTS OF THE DISCLOSURE

The present application is described below based on embodiments, but the present application is not only limited to these embodiments. In the following detailed description of the present application, some specific details are described in detail. The present application may also be fully understood by those skilled in the art without the description of these details. To avoid confusing the essence of the present application, well-known methods, processes, flows, elements and circuits are not described in detail.

In addition, those of ordinary skill in the art should be understood that the drawings provided herein are for illustrative purposes, and the drawings are not necessarily drawn to scale.

Unless otherwise specified and limited, the terms “mounted”, “connected”, “connection”, “fixed”, and the like should be understood broadly. For example, the “connection” may be a fixed connection, a detachable connection, or an integrated connection, may be a mechanical connection or an electrical connection, may be a direct connection or an indirect connection by means of an intermediate medium, or may be an internal connection of two elements or an interaction between two elements. For those of ordinary skill in the art, the specific meaning of the terms in the present application may be understood according to specific situations.

For ease of description, the spatially relative terms such as “in”, “out”, “under”, “below”, “lower”, “above”, “upper”, etc., are used to describe a relationship between one element or feature and another element or feature shown in the figures herein. It should be understood that the spatially relative terms desire to include different orientations in addition to orientations described in the figures when a device is used or operated. For example, if the device in the figures is flipped, it is described that elements “below” or “under” other elements or features are positioned to be “above” other elements or features. Therefore, exemplary terms “below” may include both orientations of “above” and “below”. The device may be oriented in other manners (rotated 90 degree or at other orientations) and the spatially relative descriptors used herein may be interpreted accordingly.

Unless the context clearly requires otherwise, similar words such as “including” and “containing” throughout the application document should be interpreted as inclusive rather than exclusive or exhaustive; that is to say, it means “including but not limited to”.

In the description of the present application, it needs to be understood that the terms “first”, “second” and the like are merely used for descriptive purposes, and cannot be understood as indicating or implying relative importance. Moreover, in the description of the present application, unless otherwise stated, “a plurality of” means two or more.

Figure 1:
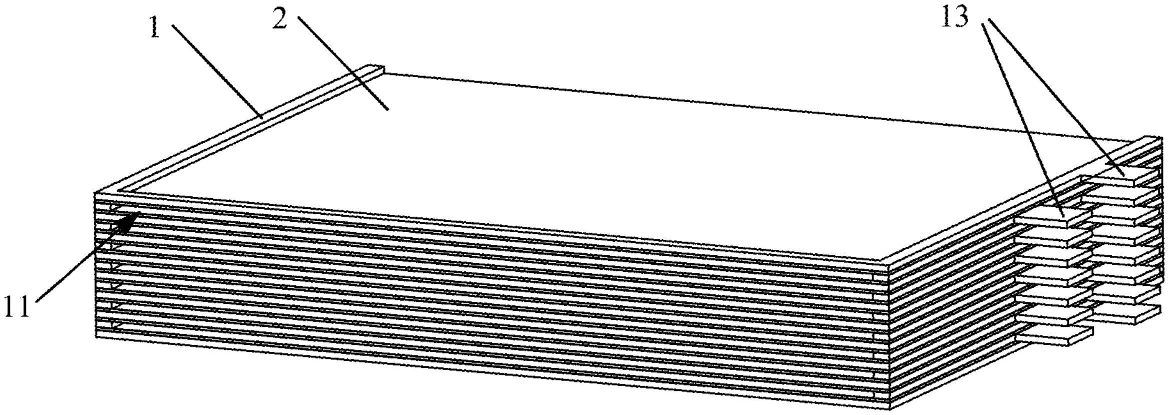
FIG. 1 is a structural schematic diagram of the first sounding component provided by an embodiment of the present disclosure.
Figure 2:
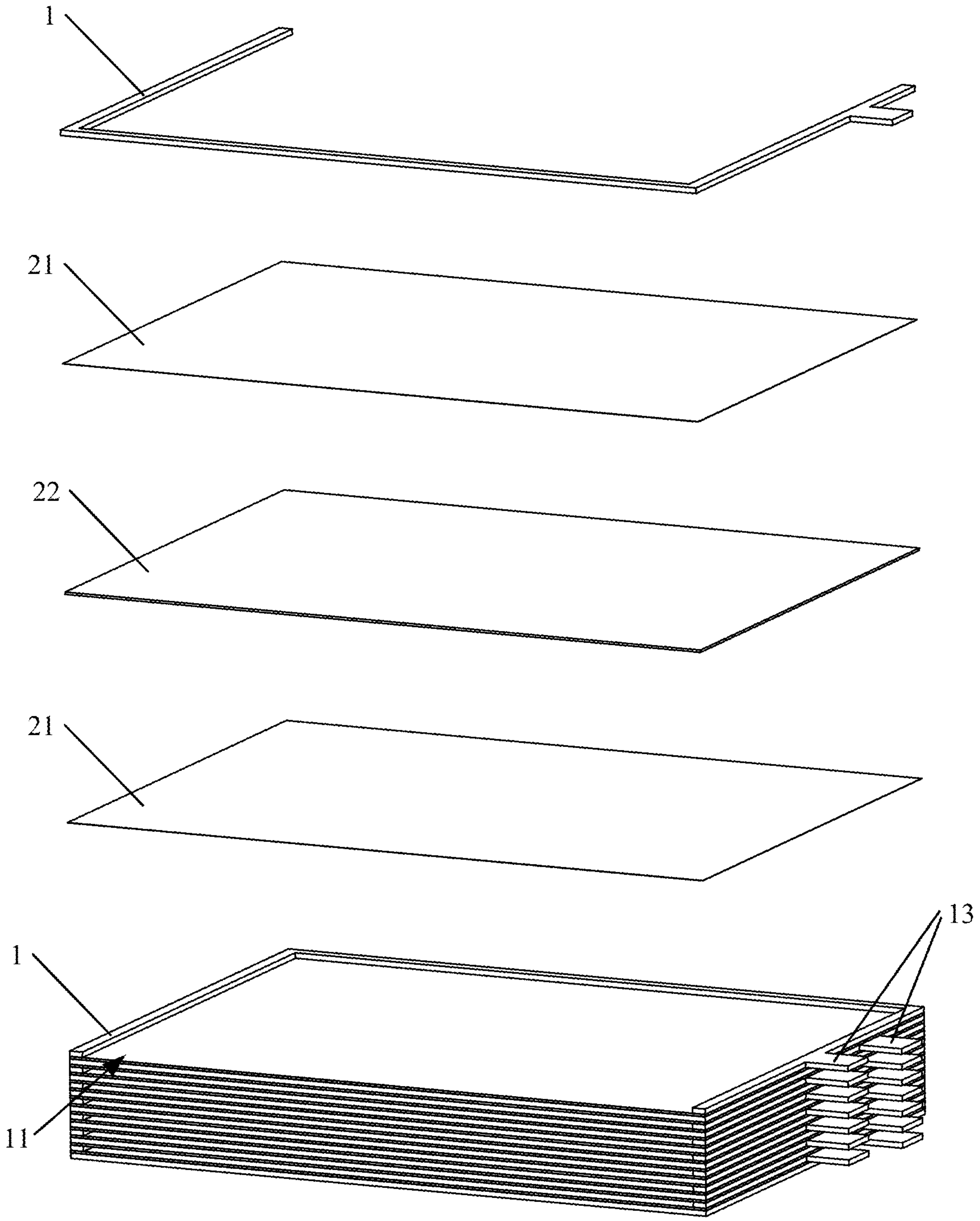
FIG. 2 is a partial exploded schematic diagram of the first sounding component provided by an embodiment of the present disclosure.

FIG. 1 is a structural schematic diagram of the first sounding component provided by an embodiment of the present disclosure, and FIG. 2 is a partial exploded schematic diagram of the first sounding component provided by an embodiment of the present disclosure. As shown in FIG. 1 and FIG. 2, the sounding component includes at least one conductive bracket 1 and at least one piezoelectric vibration unit 2. Specifically, each layer of the piezoelectric vibration unit 2 includes two layers of conductive thin films 21 and a piezoelectric thin film 22 arranged between these two layers of conductive thin films 21. It should be noted that in the embodiment shown in FIG. 1 and FIG. 2, there are multiple layers of conductive brackets 1 and multiple layers of piezoelectric vibration units 2, with a layer of conductive bracket 1 connecting between adjacent two layers of piezoelectric vibration units 2. It is easy to understand that the adjacent two layers of piezoelectric vibration units 2 are connected to the same layer of conductive bracket 1 through the conductive thin films 21 facing each other. It should be further noted that in an alternative embodiment, there are two layers of piezoelectric vibration units 2 and one layer of conductive bracket 1, and the conductive bracket 1 is located between these two layers of piezoelectric vibration units 2.

Furthermore, as shown in FIG. 1 and FIG. 2, the outermost two layers of piezoelectric vibration units 2 are respectively connected to a layer of conductive bracket 1, serving to fix the position of the outermost two layers of piezoelectric vibration units 2 and even the entire sounding component. Moreover, as shown in FIG. 1 and FIG. 2, in one embodiment, each conductive bracket 1 forms a notch 11. Thus, when the conductive bracket 1 is positioned between the piezoelectric vibration units 2, the sounding component may emit sound through the notch 11. In other words, by adjusting the position of the notch 11, the sounding component may be configured for side sound emission or front sound emission. Specifically, the position of the notch 11 matches the side edge of the piezoelectric vibration unit 2, allowing the sounding component to emit sound through the notch 11 in a side-emission manner.

It should be noted that the conductive bracket 1 is a metal bracket, and the conductive thin film 21 is a metal thin film. In one embodiment, the conductive bracket 1 is connected to the corresponding conductive thin films 21 through conductive adhesive. It should be further noted that the conductive adhesive is an adhesive that has certain conductivity after curing or drying, which may connect a variety of conductive materials together, allowing a path to be formed between the connected conductive materials.

As shown in FIG. 1 and FIG. 2, in one embodiment, each conductive bracket 1 is formed into a U-shaped structure (also known as a square-shaped structure with a notch on one side). Specifically, each conductive bracket 1 is composed of three strip-shaped parts. As a result, each conductive bracket 1 may form a notch 11, and by matching the position of the notch 11 with the side of the piezoelectric vibration unit 2, the sound emitting component may achieve side sound emission through the notch 11. Further, as shown in FIG. 1 and FIG. 2, in one embodiment, corresponding to multiple layers of conductive brackets 1, the notches 11 of adjacent two layers of conductive brackets 1 face in opposite directions. Therefore, the adjacent two layers of conductive brackets 1 may cooperate with each other, so that the position of the piezoelectric vibration unit 2 between the two layers of conductive brackets 1 is fixed, and at the same time, it may ensure that the piezoelectric vibration unit 2 may continuously and stably emit sound through the notch 11.

Figure 3:
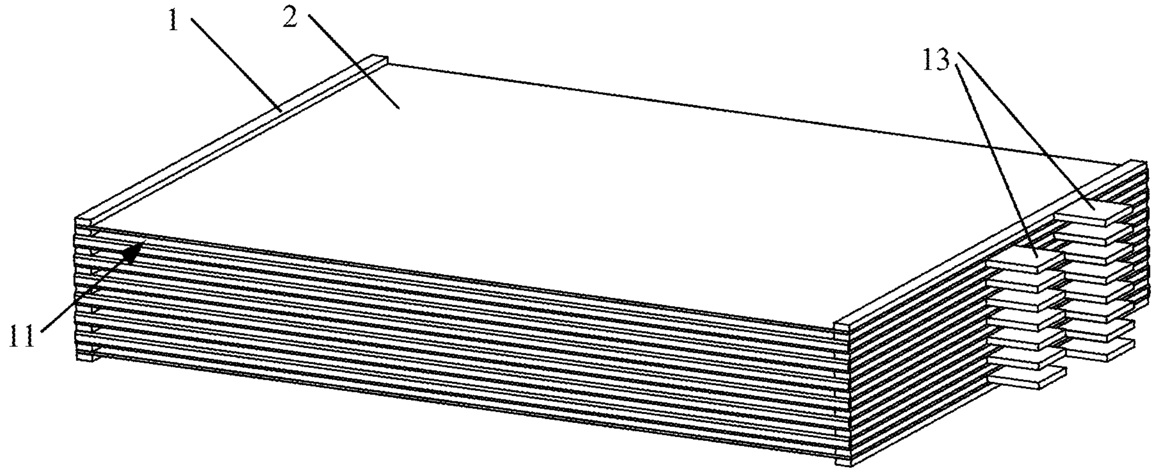
FIG. 3 is a structural schematic diagram of the second sounding component provided by an embodiment of the present disclosure.
Figure 4:
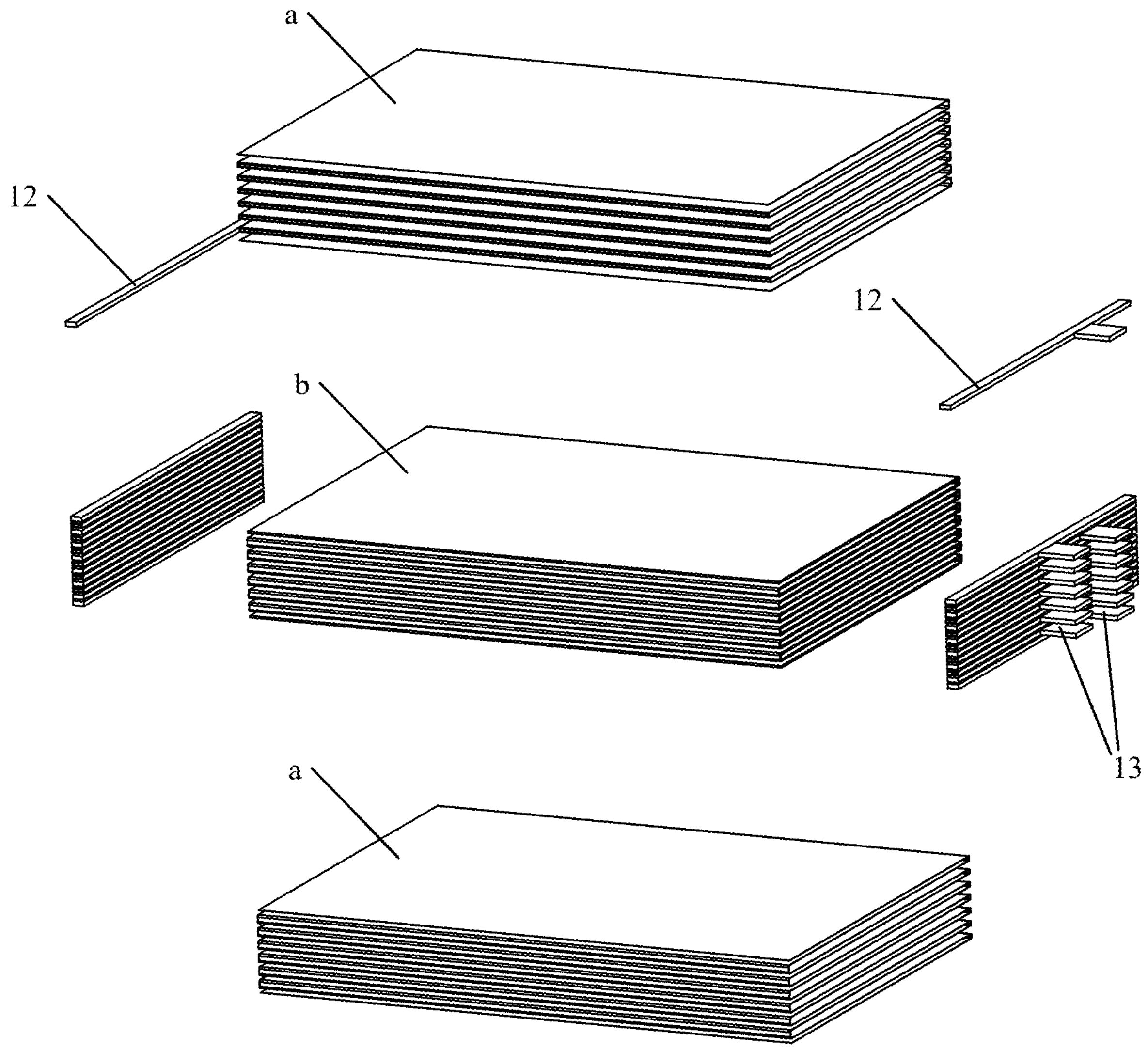
FIG. 4 is a partial exploded schematic diagram of the second sounding component provided by an embodiment of the present disclosure.

FIG. 3 is a structural schematic diagram of the second sounding component provided by an embodiment of the present disclosure, and FIG. 4 is a partial exploded schematic diagram of the second sounding component provided by an embodiment of the present disclosure. As shown in FIG. 3 and FIG. 4, as an alternative embodiment, each conductive bracket 1 forms two notches 11. Specifically, each conductive bracket 1 includes two oppositely arranged strip-shaped connecting pieces 12. Thus, each conductive bracket 1 may form two notches 11, and by matching the position of the notches 11 with the side edges of the piezoelectric vibration unit 2, the sounding component may achieve side sound emission through the notches 11. It is easy to understand that by using two separate connecting pieces 12 to form the conductive bracket 1, the arrangement of the conductive bracket 1 may be made more flexible, which helps to fix the position of the piezoelectric vibration unit 2 between the two conductive brackets 1, while ensuring that the piezoelectric vibration unit 2 may continuously and stably emit sound through the notches 11.

As shown in FIG. 3 and FIG. 4, in one embodiment, the sounding component includes two conductive sheets a and a piezoelectric sheet b positioned between the two conductive sheets a. Further, each conductive sheet a is folded according to a fixed size to form multiple layers of conductive thin films 21. That is, the conductive sheets a are folded one or more times to form multiple wavy regions, which are parallel to each other, so that each region serves as a layer of conductive thin film 21 corresponding to a layer of piezoelectric vibration unit 2. Meanwhile, the piezoelectric sheet b is folded according to a fixed size to form multiple layers of piezoelectric thin films 22. That is, the piezoelectric sheet b is folded one or more times to form multiple wavy regions, which are parallel to each other, so that each region serves as a layer of piezoelectric thin film 22 corresponding to a layer of piezoelectric vibration unit 2. It should be noted that, as shown in FIG. 3 and FIG. 4, in this embodiment, to facilitate the placement of conductive brackets 1 between each layer of piezoelectric vibration units 2, the conductive brackets 1 may adopt a split structure, that is, two connecting pieces 12 are used to form one layer of conductive brackets 1. It should be further noted that, as an alternative embodiment, multiple layers of piezoelectric vibration units 2 may be sequentially connected to form a wavy structure by setting up a connecting structure. The piezoelectric vibration units 2 formed by such folding may enhance the rigidity of the entire sounding module.

Figure 5:
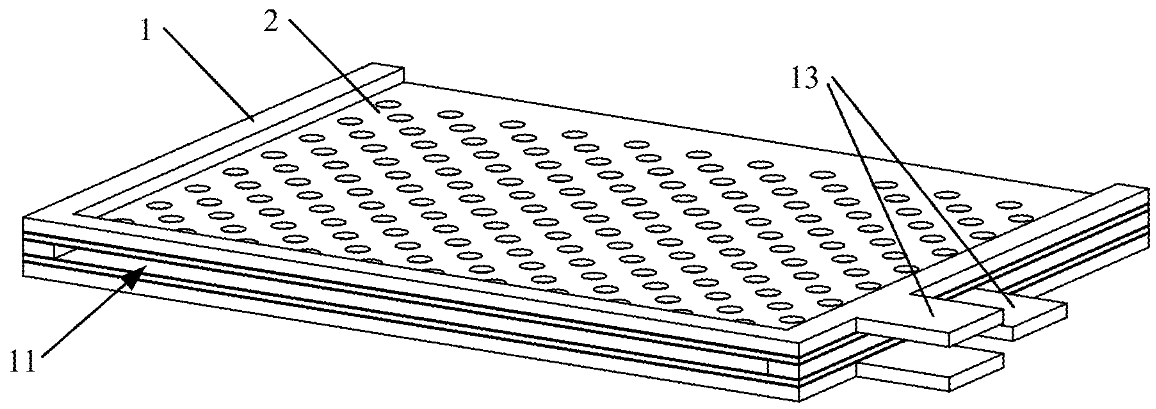
FIG. 5 is a structural schematic diagram of a third sounding component provided by an embodiment of the present disclosure.
Figure 6:
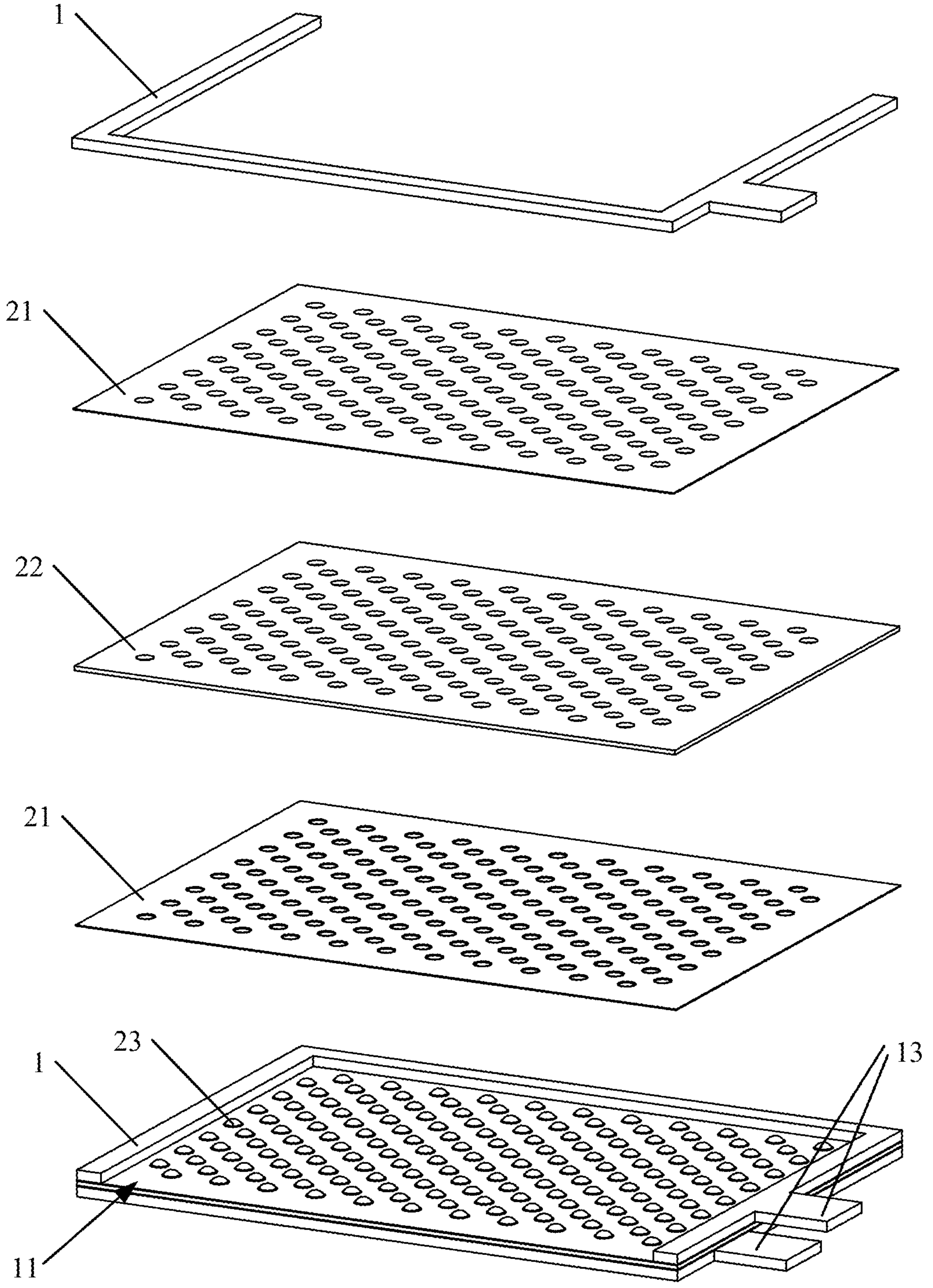
FIG. 6 is a partial exploded schematic diagram of the third sounding component provided by an embodiment of the present disclosure.

FIG. 5 is a structural schematic diagram of a third sounding component provided by an embodiment of the present disclosure, and FIG. 6 is a partial exploded schematic diagram of the third sounding component provided by an embodiment of the present disclosure. As shown in FIG. 5 and FIG. 6, in one embodiment, multiple convex parts 23 are formed on each layer of the piezoelectric vibration unit 2. Furthermore, for each layer of the piezoelectric vibration unit 2, the piezoelectric film 22 and the conductive films 21 at corresponding positions on each layer are both arched to form the corresponding convex parts 23. It should be noted that the notch 11 serving as the sound outlet corresponds to two layers of the piezoelectric vibration unit 2, and the convex parts 23 on these two layers are both arched towards the notch 11, meaning that the convex parts 23 on these two layers are oppositely arranged. It should be further noted that multiple recessed structures are formed on the surface opposite to the convex parts 23 of the piezoelectric vibration unit 2. As a result, the effective vibration area of the piezoelectric vibration unit 2 is increased, thereby enhancing the sound pressure.

As shown in FIG. 5 and FIG. 6, in one embodiment, the convex part 23 is designed as a hemispherical structure. On one hand, designing the convex part 23 as a hemispherical symmetrical structure helps ensure the stability of the vibration of the piezoelectric vibration unit 2. On the other hand, designing the convex part 23 as a hemispherical structure is more conducive to increasing the effective vibration area of the piezoelectric vibration unit 2. For example, N (N is a positive integer) hemispherical convex parts 23 are formed by arching at N planar regions on the piezoelectric vibration unit 2. Taking half of the surface area of each convex part 23 as the vibration area, the vibration area of the convex part 23 is doubled compared to a planar structure. Therefore, under the same final external conditions, the vibration area of the piezoelectric vibration unit 2 is increased by N times compared to a planar vibration unit.

Figure 7:
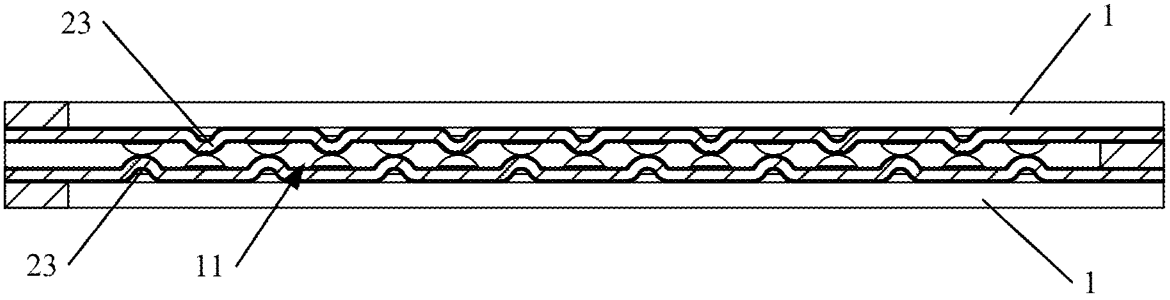
FIG. 7 is a schematic cross-sectional view of a staggered arrangement of convex parts provided by an embodiment of the present disclosure.

FIG. 7 is a schematic cross-sectional view of a staggered arrangement of convex parts provided by an embodiment of the present disclosure. As shown in FIG. 7, in one embodiment, the notch 11 serving as the sound outlet corresponds to two layers of piezoelectric vibration units 2, and the convex parts 23 on these two layers of piezoelectric vibration units 2 are arranged in a staggered manner. That is to say, the convex parts 23 on these two layers of piezoelectric vibration units 2 do not abut or collide with each other. Therefore, the gap between these two layers of piezoelectric vibration units 2 may be minimized as much as possible, which helps to reduce the overall thickness of the sounding assembly, and in turn helps to reduce the overall thickness of the piezoelectric loudspeaker equipped with the sounding component.

It should be noted that in one embodiment, corresponding to multiple layers of conductive brackets 1, one of the adjacent two layers of conductive bracket 1 connects to the first external electrode, while the other connects to the second external electrode. In other words, the conductive thin films 21 connected to each layer of conductive bracket 1 are connected to the corresponding external electrodes through that conductive bracket 1, allowing each layer of piezoelectric thin film 22 to be connected to the first external electrode and the second external electrode. Thus, by using the first external electrode and the second external electrode, a constantly alternating voltage may be applied to the piezoelectric thin film 22, so that the internal polarization of the piezoelectric thin film is achieved, facilitating vibration and repeatedly pushing air to produce sound.

As shown in FIGS. 1 to 6, in one embodiment, each conductive bracket 1 has an electrode connecting part 13 formed on one side as a protrusion. It is easy to understand that electrode connecting parts 13 are used to connect the first external electrode or the second external electrode. It should be noted that the positions of the two electrode connecting parts 13 on two adjacent conductive brackets 1 are staggered, so that the two adjacent conductive brackets 1 may be connected to different external electrodes. It needs further explanation that the positions of multiple electrode connecting parts 13 connected to the first external electrode correspond to each other, and the positions of multiple electrode connecting parts 13 connected to the second external electrode correspond to each other, allowing the conductive brackets 1 to be conveniently connected to the corresponding external electrodes simultaneously. Therefore, multiple piezoelectric vibration units 2 may be arranged in parallel, so that a larger sound pressure may be obtained by stacking multiple piezoelectric vibration units 2.

Figure 8:
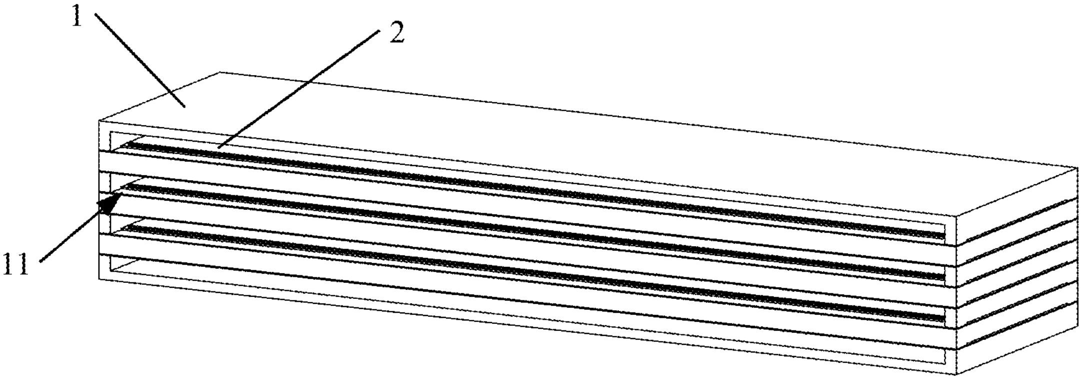
FIG. 8 is a structural schematic diagram of the fourth sounding component provided by an embodiment of the present disclosure.
Figure 9:
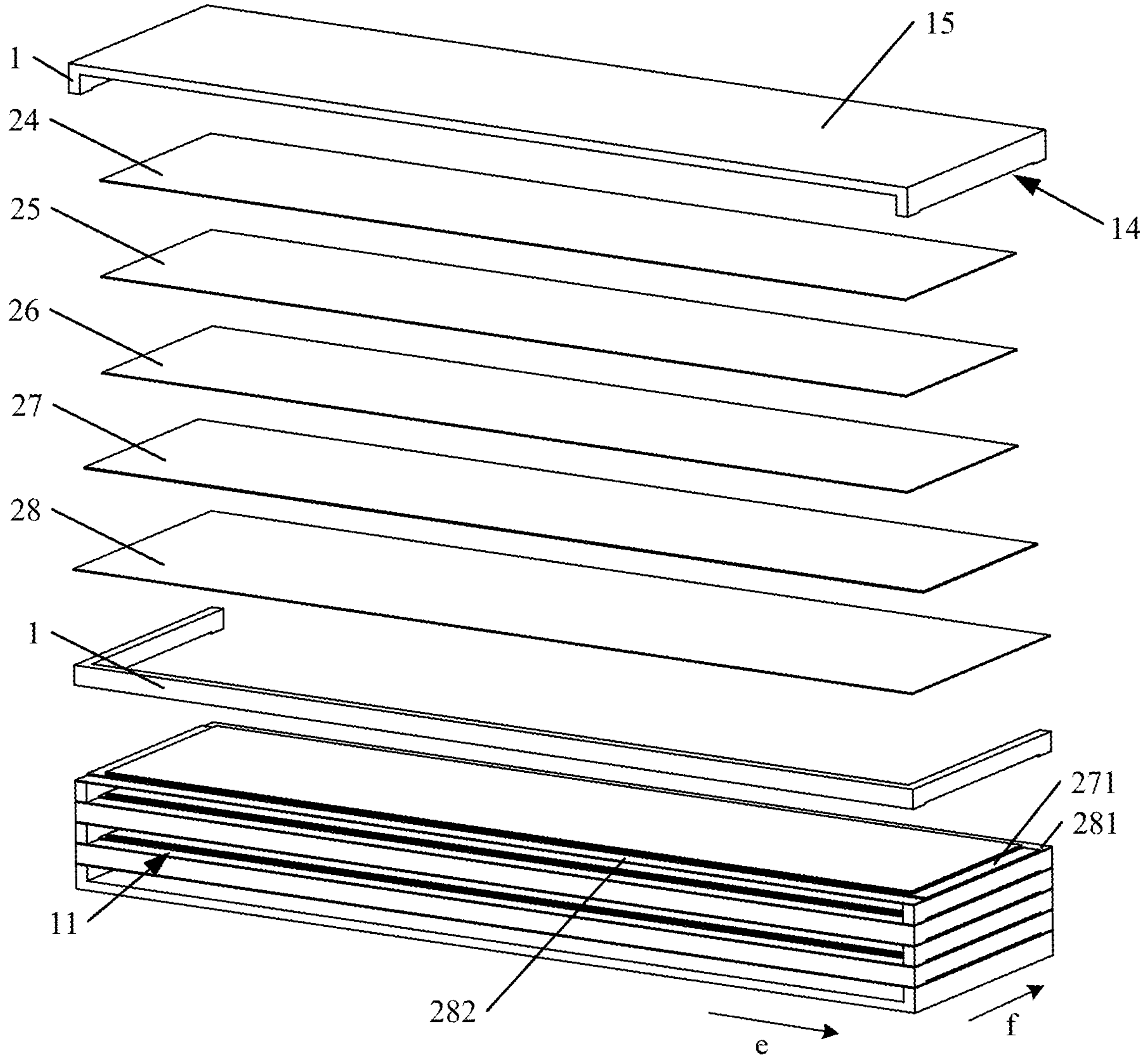
FIG. 9 is a partial exploded schematic diagram of the fourth sounding component provided by an embodiment of the present disclosure.
Figure 10:
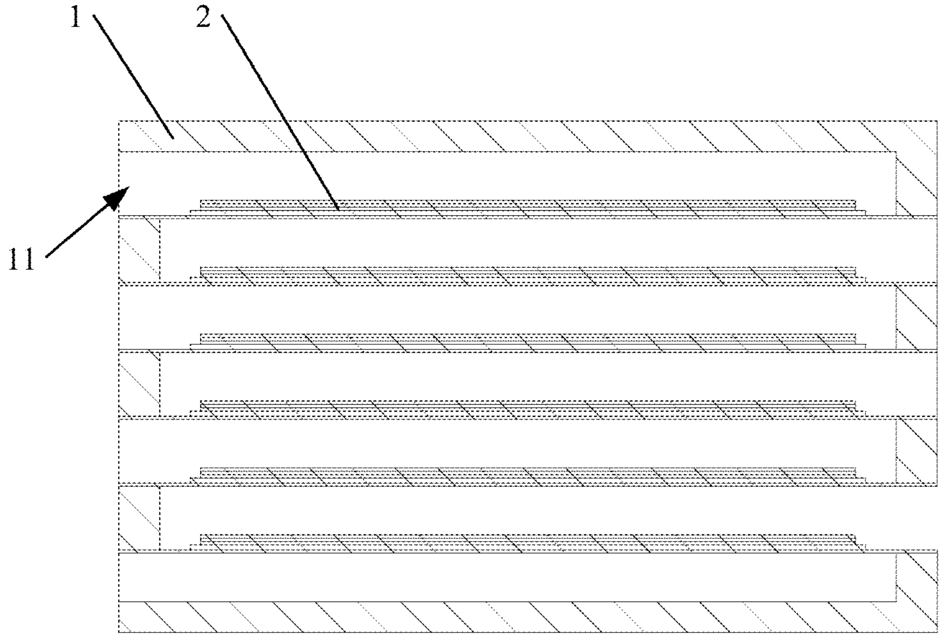
FIG. 10 is a cross-sectional schematic diagram of the fourth sounding component provided by an embodiment of the present disclosure.

FIG. 8 is a structural schematic diagram of the fourth sounding component provided by an embodiment of the present disclosure, FIG. 9 is a partial exploded schematic diagram of the fourth sounding component provided by an embodiment of the present disclosure, and FIG. 10 is a cross-sectional schematic diagram of the fourth sounding component provided by an embodiment of the present disclosure. As shown in FIG. 8, FIG. 9, and FIG. 10, in one embodiment, the piezoelectric vibration unit 2 comprises, from top to bottom, a first piezoelectric ceramic 24, a second piezoelectric ceramic 25, a third piezoelectric ceramic 26, a metal substrate 27, and an elastic thin film 28, which are sequentially stacked. Furthermore, each conductive bracket 1 forms a notch 11, allowing the first piezoelectric ceramic 24, the second piezoelectric ceramic 25, and the third piezoelectric ceramic 26, once connected to an external circuit, to convert electrical energy into mechanical energy using the inverse piezoelectric effect, thereby vibrating the elastic thin film 28 and producing sound by pushing air. Additionally, each conductive bracket 1 forms a notch 11, and the position of the notch 11 matches the side of the piezoelectric vibration unit 2, allowing the sounding component to emit sound through the notch 11. Optionally, each conductive bracket 1 is formed as a U-shaped structure. Specifically, each conductive bracket 1 is composed of three strip-shaped parts. Thus, each conductive bracket 1 may form a notch 11, and by matching the position of the notch 11 with the side of the piezoelectric vibration unit 2, the sounding component may emit sound through the notch 11. Furthermore, there are multiple layers of conductive brackets 1, and the notches 11 of adjacent layers of conductive brackets 1 face in opposite directions. This allows the adjacent layers of conductive brackets 1 to cooperate, stabilizing the position of the piezoelectric vibration unit 2 between them and ensuring that it may consistently and stably emit sound through the notches 11. Optionally, each conductive bracket 1 forms two notches 11. Specifically, each conductive bracket 1 includes two oppositely arranged strip-shaped connecting pieces 12. Thus, each conductive bracket 1 may form two notches 11, and by matching the position of the notches 11 with the side of the piezoelectric vibration unit 2, the sounding component may emit sound through the notches 11. It is easy to understand that by using two separate connecting pieces 12 to form the conductive bracket 1, the arrangement of the conductive bracket 1 may be made more flexible, which helps to fix the position of the piezoelectric vibration unit 2 between the two layers of conductive brackets 1, while ensuring that the piezoelectric vibration unit 2 may continuously and stably emit sound through the notch 11. It should be noted that the elastic thin film 28 in this embodiment is made of elastic materials such as polyurethane or silicone, and the metal substrate 27 is connected to the conductive bracket 1 through the elastic thin film 28 to increase the amount of deformation. Alternatively, the metal substrate 27 and the elastic thin film 28 may be replaced with a layer of metal diaphragm.

Figure 11:
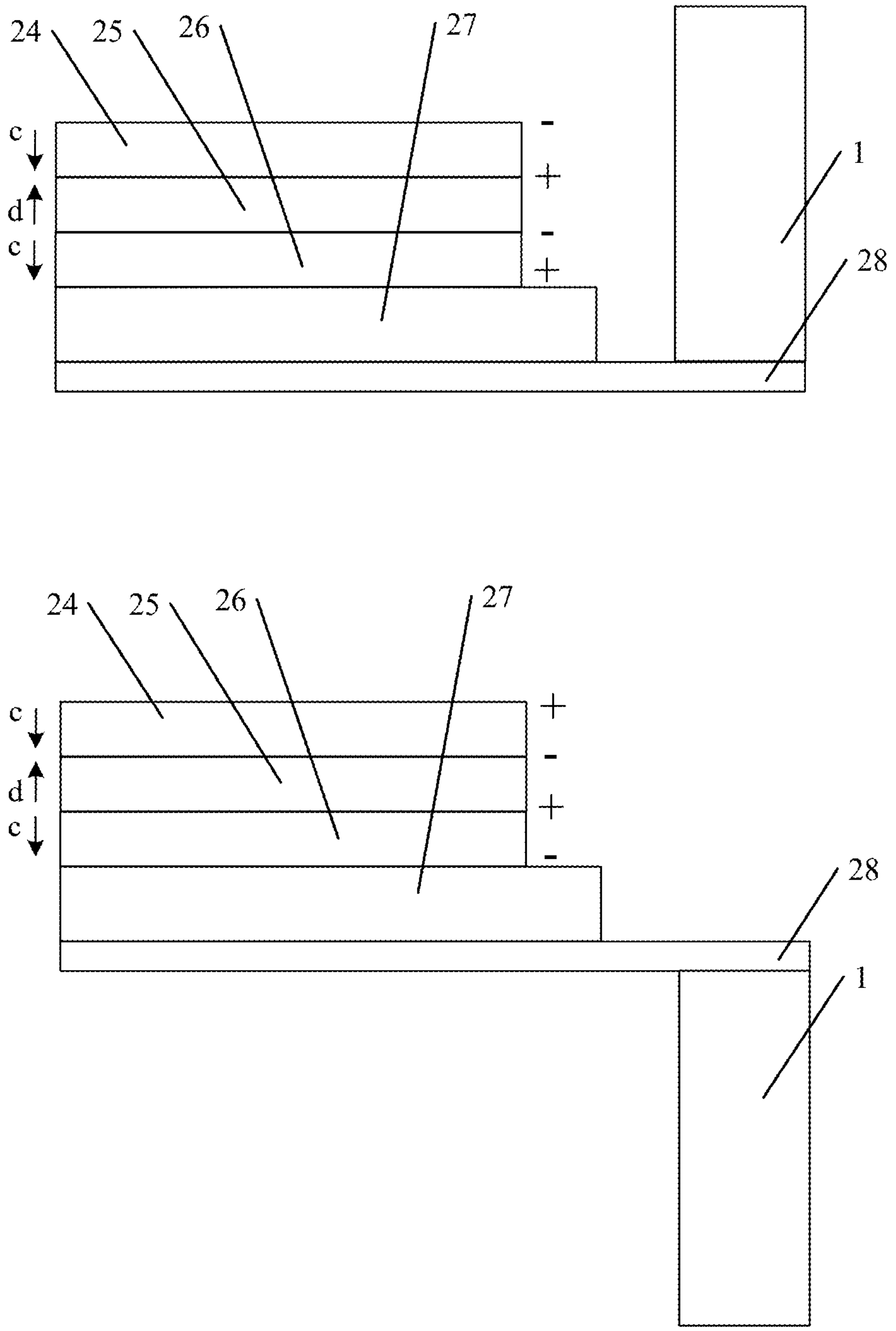
FIG. 11 is a schematic diagram of the polarization direction and electrode connecting way of adjacent two layers of piezoelectric vibration units provided by an embodiment of the present disclosure.

FIG. 11 is a schematic diagram of the polarization direction and electrode connecting way of adjacent two layers of piezoelectric vibration units provided by an embodiment of the present disclosure. As shown in FIG. 11, in one embodiment, for the adjacent two layers of piezoelectric vibration units 2, the first piezoelectric ceramic 24 and the third piezoelectric ceramic 26 are set to the first polarization direction c, and the second piezoelectric ceramic 25 is set to the second polarization direction d. That is to say, the polarization directions of the multiple layers of piezoelectric ceramics in the adjacent two layers of piezoelectric vibration units 2 are the same. It should be noted that the first polarization direction c and the second polarization direction d are two opposite directions in the thickness direction of the piezoelectric ceramic (the vertical direction in FIG. 11). For example, the first polarization direction c of the first piezoelectric ceramic 24 and the third piezoelectric ceramic 26 is from top to bottom, and the second polarization direction d of the second piezoelectric ceramic 25 is from bottom to top.

Figure 12:
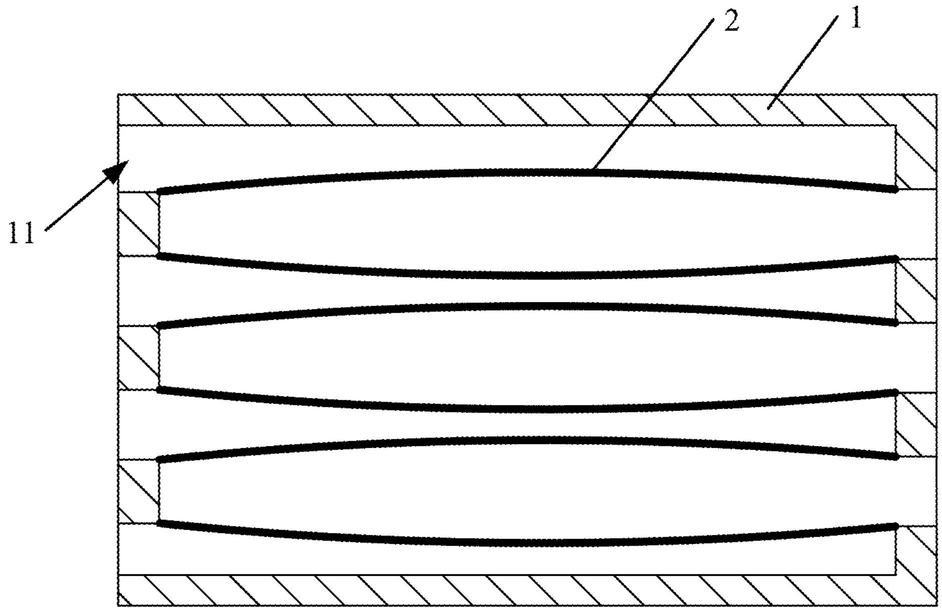
FIG. 12 is a schematic diagram of the vibration effect of the fourth sounding component provided by this embodiment of the disclosure.

Furthermore, as shown in FIG. 11, in one embodiment, the electrode connecting ways for the adjacent two layers of piezoelectric vibration units 2 are opposite. Specifically, for the adjacent two layers of piezoelectric vibration units 2, the electrode connecting way of the first piezoelectric ceramic 24 in the upper piezoelectric vibration unit 2 is opposite to that of the first piezoelectric ceramic 24 in the lower piezoelectric vibration unit 2, the electrode connecting way of the second piezoelectric ceramic 25 in the upper piezoelectric vibration unit 2 is opposite to that of the second piezoelectric ceramic 25 in the lower piezoelectric vibration unit 2, and the electrode connecting way of the third piezoelectric ceramic 26 in the upper piezoelectric vibration unit 2 is opposite to that of the third piezoelectric ceramic 26 in the lower piezoelectric vibration unit 2. For example, the first piezoelectric ceramic 24 in the upper piezoelectric vibration unit 2 is connected to the negative electrode on the top and the positive electrode on the bottom, the second piezoelectric ceramic 25 in the upper piezoelectric vibration unit 2 is connected to the positive electrode on the top and the negative electrode on the bottom, and the third piezoelectric ceramic 26 in the upper piezoelectric vibration unit 2 is connected to the negative electrode on the top and the positive electrode on the bottom; conversely, the first piezoelectric ceramic 24 in the lower piezoelectric vibration unit 2 is connected to the positive electrode on the top and the negative electrode on the bottom, the second piezoelectric ceramic 25 in the lower piezoelectric vibration unit 2 is connected to the negative electrode on the top and the positive electrode on the bottom, and the third piezoelectric ceramic 26 in the lower piezoelectric vibration unit 2 is connected to the positive electrode on the top and the negative electrode on the bottom. FIG. 12 is a schematic diagram of the vibration effect of the fourth sounding component provided by this embodiment of the disclosure. As shown in FIG. 12, the adjacent two layers of piezoelectric vibration units 2 may vibrate in opposite directions. Therefore, under the same voltage, the sounding component may obtain a higher sound pressure level, and the sounding component may be well applied in the mid-tone field.

As shown in FIG. 9, in one embodiment, the metal substrate 27 extends to both sides in the first extending direction e, forming first extending parts 271, and the elastic thin film 28 extends to both sides in the first extending direction e, forming second extending parts 281. It should be noted that the first extending direction e is the lengthwise direction of the rectangular sounding component. It is easy to understand that the lengths of the metal substrate 27 and the elastic thin film 28 are both greater than those of the first piezoelectric ceramic 24, the second piezoelectric ceramic 25, and the third piezoelectric ceramic 26, so the first extending parts 271 of the metal substrate 27 and the second extending parts 281 of the elastic thin film 28 may be exposed from both ends of the piezoelectric ceramics. Furthermore, the first extending parts 271 and the second extending parts 281 are sandwiched between two layers of conductive brackets 1, so as to achieve the fixation of the piezoelectric vibration unit 2.

As shown in FIG. 9, in one embodiment, a conductive bracket 1 has profiling grooves 14 recessed into it. It should be noted that the profiling grooves 14 match the first extending parts 271. Furthermore, when the first extending parts 271 and the second extending parts 281 are sandwiched between two layers of conductive brackets 1, the first extending parts 271 are embedded in the profiling grooves 14. Thus, the profiling grooves 14 may play a positioning role in the assembly of the piezoelectric vibration unit 2 and the conductive bracket 1.

As shown in FIG. 9, in one embodiment, the elastic thin film 28 extends on both sides in the second extending direction f to form third extending parts 282. It should be noted that the second extending direction f is the width direction of the rectangular sounding component. It is easy to understand that the width of the elastic thin film 28 is greater than that of the first piezoelectric ceramic 24, the second piezoelectric ceramic 25, the third piezoelectric ceramic 26, and the metal substrate 27, so the third extending parts 282 of the elastic thin film 28 may be exposed from both sides of the piezoelectric ceramics and the metal substrate 27. Furthermore, the third extending parts 282 on both sides are respectively connected to a layer of conductive bracket 1, in order to achieve the fixation of the piezoelectric vibration unit 2.

As shown in FIG. 9, in one embodiment, the two conductive brackets 1 located at the edge are enclosed along the end face to form blocking parts 15. That is to say, the top of the conductive bracket 1 at the uppermost layer in the sounding component is enclosed to form a blocking part 15, and the bottom of the conductive bracket 1 at the lowermost layer in the sounding component is enclosed to form a blocking part 15. Thus, the blocking parts 15 may protect the piezoelectric vibration unit 2.

Figure 13:
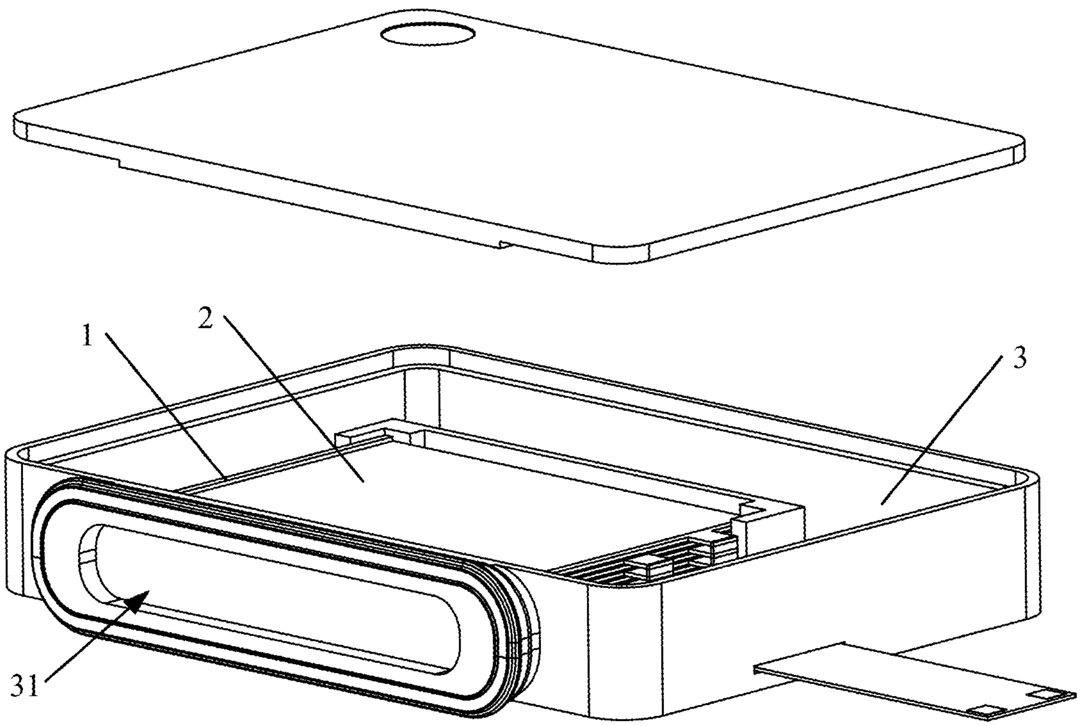
FIG. 13 is a partial exploded schematic diagram of a piezoelectric loudspeaker provided in an embodiment of the present disclosure.

FIG. 13 is a partial exploded schematic diagram of a piezoelectric loudspeaker provided in an embodiment of the present disclosure. As shown in FIG. 13, the piezoelectric loudspeaker includes a housing 3 and a sounding component. It should be noted that the specific structure of the sounding component is as previously described and will not be repeated here. Furthermore, the sounding component is arranged inside the housing 3. Moreover, the housing 3 is provided with a sound outlet 31, and at least some of the notches 11 in the sounding component are aligned with the sound outlet 31, that is, the notches 11 for side sound emission are all arranged to align with the sound outlet 31.

Figure 14:
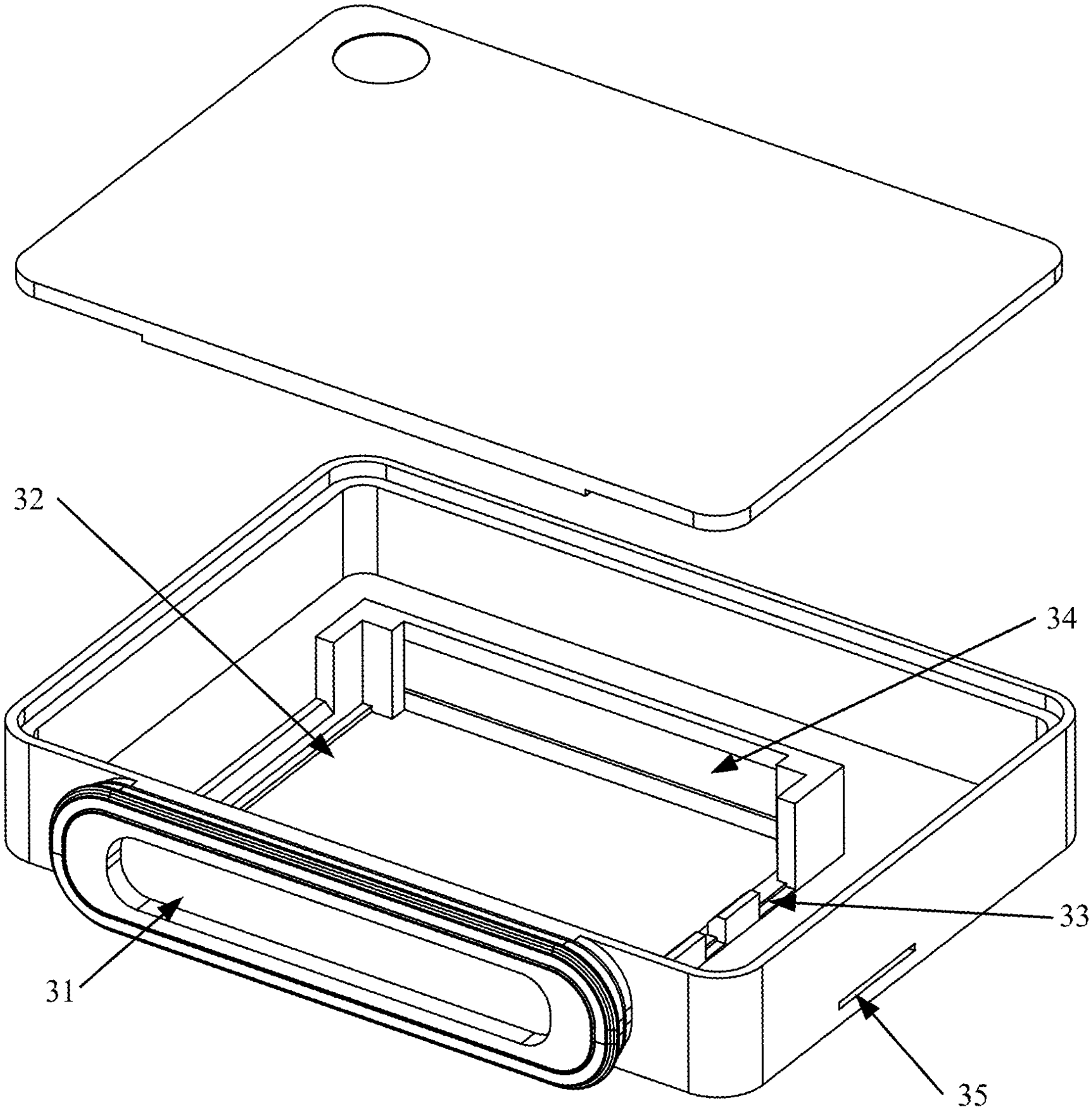
FIG. 14 is a partial exploded schematic diagram of a housing provided by an embodiment of the present disclosure.

FIG. 14 is a partial exploded schematic diagram of a housing provided by an embodiment of the present disclosure. As shown in FIG. 14, in one embodiment, the interior of the housing 3 is formed with an accommodating groove 32, and the structure of the accommodating groove 32 is matched with the sounding component to accommodate the sounding component. It should be noted that the sounding component in this embodiment is arranged as a rectangular structure as a whole, and the accommodating groove 32 is correspondingly arranged as a rectangular groove. As an alternative embodiment, the sounding component may be arranged as a cylindrical structure as a whole, and the accommodating groove 32 is correspondingly arranged as a circular groove. Furthermore, the groove wall of the accommodating groove 32 is recessed to form avoiding grooves 33, so that the electrode connecting parts 13 of the conductive bracket 1 may extend through the avoiding grooves 33.

As shown in FIG. 14, in one embodiment, the accommodating groove 32 has a first through hole 34 on the groove wall opposite to the sound outlet 31, allowing communication with the rear chamber through the first through hole 34. Furthermore, as an alternative embodiment, both the sound outlet 31 and the first through hole 34 are equipped with sealing foam. On the other hand, the housing 3 also has a second through hole 35, and the position of the second through hole 35 is opposite to the avoiding groove 33, so that the external circuit may be connected to the electrode connecting parts 13 of the conductive bracket 1 through the second through hole 35.

The embodiment of the present disclosure provides a sounding component and a piezoelectric speaker, wherein the sounding component comprises at least one layer of conductive bracket and multiple layers of piezoelectric vibration units. Each conductive bracket is formed with at least one notch, and a layer of conductive bracket is connected between adjacent two layers of piezoelectric vibration units, so that the sounding component may emit sound through the notch. Thus, by arranging the conductive bracket with notches to determine the sound emitting direction, it helps to meet the design requirement of the piezoelectric speaker for side sound emission.

The above descriptions are only the preferred embodiments of the present application and are not intended to limit the present application, and various alterations and changes may be made in the present application for those skilled in the art. Any modification, equivalent replacement, improvement and the like made within the spirit and principle of the present application should fall within the protection scope of the present application.

We claim:

1. A sounding component, comprises:

at least one layer of conductive bracket, each layer of the conductive bracket is formed with at least one notch; and multiple layers of piezoelectric vibration unit, wherein a layer of the conductive bracket is connected between two adjacent layers of the piezoelectric vibration unit to allow the sounding component to emit sound through the notch;

wherein each layer of the conductive bracket is formed into a U-shaped structure;

the sounding component comprises multiple layers of the conductive bracket, and notches of adjacent two layers of the conductive bracket face in opposite directions.

2. The sounding component according to claim 1, wherein each layer of the conductive bracket comprises two oppositely arranged strip-shaped connecting pieces, and the two connecting pieces are arranged at both ends of the piezoelectric vibration unit.

3. The sounding component according to claim 1, wherein the piezoelectric vibration unit comprises two layers of conductive thin film and a piezoelectric thin film arranged between the two layers of conductive thin film.

4. The sounding component according to claim 3, wherein the conductive bracket is connected to the corresponding conductive thin films through conductive adhesive.

5. The sounding component according to claim 3, comprises two conductive sheets and a piezoelectric sheet arranged between the two conductive sheets;

each conductive sheet is folded to form multiple layers of the conductive thin film;

the piezoelectric sheet is folded to form multiple layers of the piezoelectric thin film.

6. The sounding component according to claim 3, wherein multiple convex parts are formed by arching on each layer of the piezoelectric vibration unit.

7. The sounding component according to claim 6, wherein the convex parts on the adjacent two layers of the piezoelectric vibration unit are arranged in a staggered manner.

8. The sounding component according to claim 1, wherein the piezoelectric vibration unit comprises a first piezoelectric ceramic, a second piezoelectric ceramic, a third piezoelectric ceramic, a metal substrate, and an elastic thin film stacked in sequence.

9. The sounding component according to claim 8, wherein the first piezoelectric ceramic and the third piezoelectric ceramic are arranged with a first polarization direction, the second piezoelectric ceramic is arranged with a second polarization direction, and the first polarization direction is opposite to the second polarization direction.

10. The sounding component according to claim 9, wherein electrode connecting ways of the adjacent two layers of the piezoelectric vibration unit are opposite.

11. The sounding component according to claim 8, wherein the metal substrate extends to both sides in the first extending direction to form first extending parts;

the elastic thin film extends to both sides in the first extending direction to form second extending parts;

the first extending parts and the second extending parts are sandwiched between two layers of the conductive bracket.

12. The sounding component according to claim 11, wherein profiling grooves are recessed on the conductive bracket, the profiling grooves are matched with the first extending parts, and the first extending parts are embedded in the profiling grooves.

13. The sounding component according to claim 8, wherein the elastic thin film extends to both sides in the second extending direction to form third extending parts, and the third extending parts are connected to the conductive bracket.

14. The sounding component according to claim 13, wherein the two layers of conductive bracket located at the edge are enclosed along the end face to form blocking parts.

15. A piezoelectric loudspeaker, comprises:

a housing, wherein the housing is provided with a sound outlet; and the sounding component of claim 1, wherein the sounding component is arranged inside the housing, and the notch is aligned with the sound outlet.

16. The piezoelectric loudspeaker according to claim 15, wherein the housing is provided with an accommodating groove inside, and the groove wall of the accommodating groove opposite to the sound outlet is provided with a first through hole.

* * * * *